US010295598B2

(12) United States Patent
Magoni et al.

(10) Patent No.: US 10,295,598 B2
(45) Date of Patent: May 21, 2019

(54) METHOD FOR DETERMINING THE OPERATING STATUS OF A SPRING CHARGING MOTOR FOR A LV OR MV SWITCHING APPARATUS AND A DIAGNOSTIC SYSTEM IMPLEMENTING SAID METHOD

(71) Applicant: ABB Schweiz AG, Baden (CH)

(72) Inventors: Stefano Magoni, Osio Sotto (IT); Massimo Scarpellini, Dalmine (IT); Alessandro Oprandi, Dalmine (IT)

( * ) Notice: Subject to any disclaimer, the term of this patent is extended or adjusted under 35 U.S.C. 154(b) by 0 days.

(21) Appl. No.: 15/561,478

(22) PCT Filed: Mar. 4, 2016

(86) PCT No.: PCT/EP2016/054689
§ 371 (c)(1),
(2) Date: Sep. 25, 2017

(87) PCT Pub. No.: WO2016/150680
PCT Pub. Date: Sep. 29, 2016

(65) Prior Publication Data
US 2018/0059188 A1     Mar. 1, 2018

(30) Foreign Application Priority Data
Mar. 23, 2015    (EP) .................................... 15160331

(51) Int. Cl.
     *G01R 31/34*      (2006.01)
     *H02P 29/024*      (2016.01)
     *H01H 71/70*      (2006.01)
(52) U.S. Cl.
     CPC .......... *G01R 31/343* (2013.01); *H01H 71/70* (2013.01); *H02P 29/0241* (2016.02); *H01H 2235/01* (2013.01)

(58) Field of Classification Search
CPC ........................... H02P 29/0241; H01H 71/70
(Continued)

(56) References Cited

U.S. PATENT DOCUMENTS

| 4,965,513 A | 10/1990 | Haynes et al. |
| 5,760,359 A * | 6/1998 | Nakano .............. G01D 5/24404 318/400.05 |

(Continued)

OTHER PUBLICATIONS

European Search Report, EP15160331, ABB Technology AG, dated Sep. 3, 2015, 6 pages.
(Continued)

*Primary Examiner* — David Luo
(74) *Attorney, Agent, or Firm* — Taft Stettinius & Hollister LLP; J. Bruce Schelkopf (57) ABSTRACT

A method is provided for determining the operating status of a spring charging motor of a LV or MV switching apparatus. The method includes acquiring a detection signal ($I_D$) indicative of the behavior of a driving current ($I_{MOT}$); processing the detection signal ($I_D$) to calculate a steady-state detection signal ($I_{DSS}$) indicative of the behavior of the driving current ($I_{MOT}$) during a steady-state time interval ($T_{SS}$); processing the steady-state detection signal ($I_{DSS}$) to calculate data (DS) indicative of HF and LF spectral components of the driving current ($I_{MOT}$); processing the data (DS) to calculate first and second harmonic distortion values ($THD_{LF}$, $THD_{HF}$); processing the first and second harmonic distortion values to calculate first and second output data ($O_1$, $O_2$), which are indicative of the variations of the first and second harmonic distortion values with respect to corresponding first and second reference values, respectively.

20 Claims, 9 Drawing Sheets

(58) Field of Classification Search
USPC .......................................... 318/3, 34
See application file for complete search history.

(56) References Cited

U.S. PATENT DOCUMENTS 7,436,146 B2 * 10/2008 Shim .................... G05B 19/416
                                                          318/685
7,539,549 B1      5/2009 Discenzo et al.

OTHER PUBLICATIONS

International Search Report and Written Opinion, PCT/EP2016/054689. ABB Technology AG, dated Jun. 14, 2016, 11 pages.
Nandi, et al., Condition Monitoring and Fault Diagnosis of Electrical Motors—A Review, IEEE Transactions on Energy Conversion, vol. 20, No. 4, Dec. 2005, 11 pages.
Mehala, et al., Motor Current Signature Analysis and its Applications in Induction Motor Fault Diagnosis, International Journal of Systems Applications, Engineering & Development, vol. 2, Issue 1, 2007, 7 pages.

* cited by examiner

METHOD FOR DETERMINING THE OPERATING STATUS OF A SPRING CHARGING MOTOR FOR A LV OR MV SWITCHING APPARATUS AND A DIAGNOSTIC SYSTEM IMPLEMENTING SAID METHOD

The present invention relates to the field of switching apparatuses for low or medium voltage applications, such as circuit breakers, contactors, disconnectors, reclosers or the like.

For the purposes of the present invention, the term "low voltage" (LV) identifies voltages lower than 1 kV AC and 1.5 kV DC whereas the term "medium voltage" (MV) identifies voltages higher than 1 kV AC and 1.5 kV DC up to some tens of kV, e.g. up to 72 kV AC and 100 kV DC.

More particularly, the present invention relates to a method for determining the operating status of an electric motor for charging an actuation spring in a LV or MV switching apparatus.

In a further aspect, the present invention relates to a diagnostic system implementing said method.

As it is known, LV or MV switching apparatuses generally comprise one or more electric poles, each one comprising at least a movable contact and a corresponding fixed contact.

An actuation chain causes a reversible movement of the movable contacts between a closed position, in which they are coupled to the corresponding fixed contacts, and an open position, in which they are spaced away from the corresponding fixed contacts.

Typically, said actuation chain comprises an actuation spring, which is adapted to store mechanical energy to be used for separating the electric contacts of the electric poles, during an opening manoeuvre.

In many switching apparatuses of the state of the art, an electric motor (here referred to also with the "spring charging motor") is used for charging the actuation spring after an opening manoeuvre.

Such an electric motor may be supplied both with a DC and AC single-phase voltage and is typically operated after the execution of each opening manoeuvre of the related switching apparatus.

A drawback of these switching apparatuses consists in that the spring charging motor may be subject to failures or decay phenomena, which may determine sudden out of service conditions for the whole switchgear.

In the attempt of facing this issue, some switching apparatuses are provided with diagnostic systems configure to measure the charging time of the actuation spring during an operation cycle of the electric motor, as an excessively long charging time is generally indicative of the presence of failure conditions in the electric motor.

Unfortunately, this solution provides partial and incomplete diagnostic data.

The experience has shown that a spring charging motor may be subject to sudden failures even if no abnormal charging time of the actuation spring is measured.

In other switching apparatuses, there are adopted diagnostic systems configure to detect vibrations of the electric motor during its operating cycle.

The main drawback of this solution consists in that it does not allow collecting any diagnostic information about possible decay phenomena of the electric parts of the electric motor, e.g. at the motor brushes, windings, and the like.

Further, it has been proven that this solution may provide wrong diagnostic data if the electric motor is operatively positioned in a noisy environment.

In the state of the art, it is therefore quite felt the need for technical solutions that are capable of overcoming the technical issues described above and allow collecting reliable information (even of the predictive type) about the operating status of the spring charging motor of a LV or MV switching apparatus in order to avoid or reduce the probability of unexpected out of service conditions of this latter.

In order to respond to this need, the present invention provides a method for determining the operating status of a spring charging motor for a LV or MV switching apparatus, according to the following claim 1 and the related dependent claims.

In a further aspect, the present invention provides a diagnostic system for determining the operating status of a spring charging motor for a LV or MV switching apparatus according to the following claim 7 and the related dependent claims.

In yet a further aspect, the present invention relates to a switching apparatus, according to the following claim 15.

Further characteristics and advantages of the method and diagnostic system, according to the present invention, will become more apparent from the detailed description of preferred embodiments illustrated only by way of non-limitative example in the accompanying drawings, in which.

Referring to the cited figures, the present invention is related to a method 100 and diagnostic system 1 for determining the operating status of a spring charging motor 10 for a switching apparatus 50.

The switching apparatus 50 (FIG. 1) comprises one or more electric poles, each of which comprises a movable contact 51 and a fixed contact 52, which are coupled to a conductor (e.g. a phase conductor) of a power distribution line (not shown).

Figure 1:
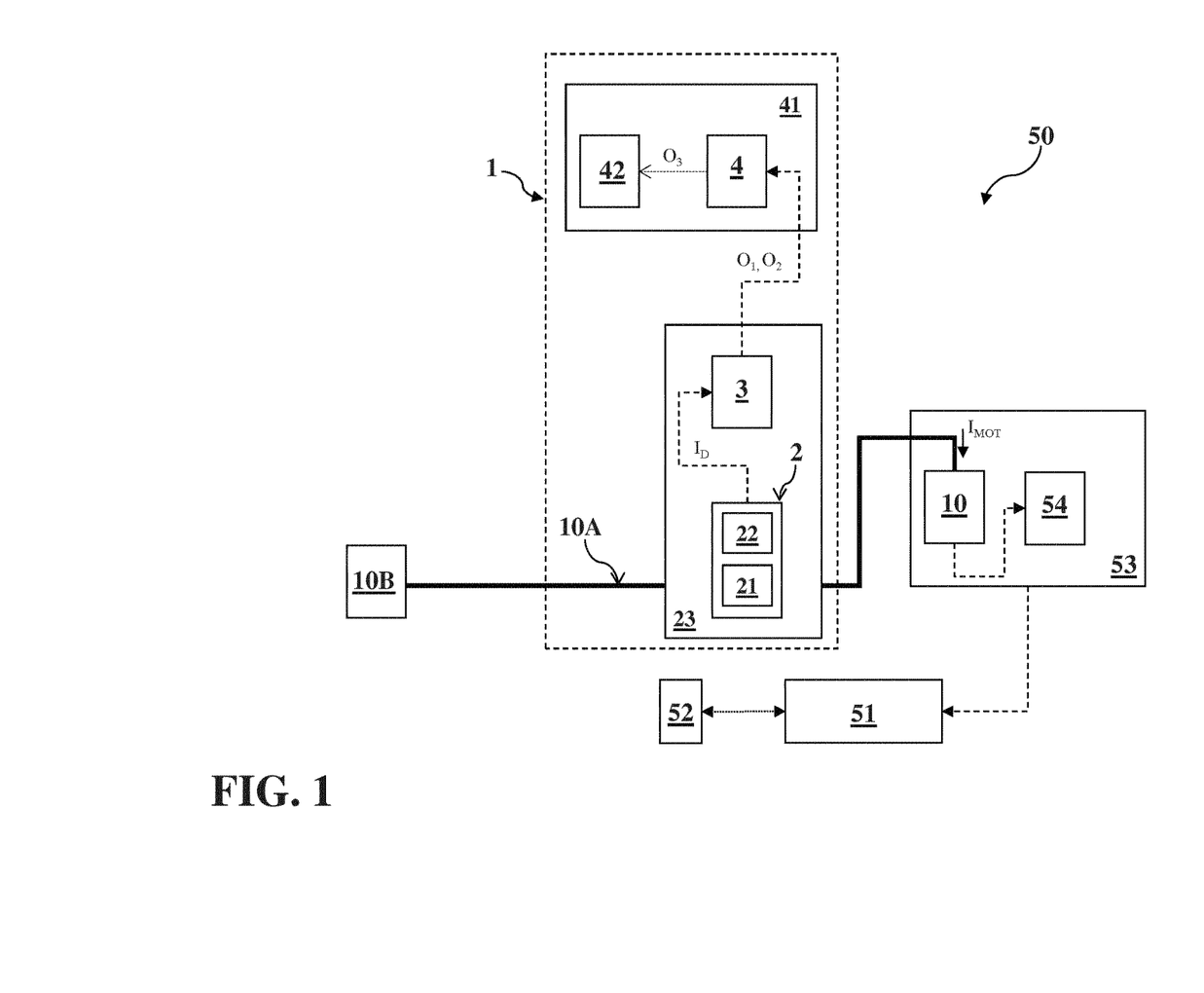
FIG. 1 is a block diagram that schematically shows a switching device comprising a diagnostic system, according to an aspect of the invention.

The movable contact 51 and the fixed contact 52 of each pole are adapted to be coupled or uncoupled respectively during the switching operations of the switching apparatus 50.

A switching operation may be a closing operation, in which the contacts 51, 52 are brought from an uncoupled state to a coupled state, or an opening operation, in which the contacts 51 and 52 are brought from a coupled state to an uncoupled state.

The switching apparatus 50 comprises an actuation chain 53 for actuating the movable contacts 51 of the electric poles.

The actuation chain 53 comprises an actuation spring 54, which is tripped during an opening operation of the switching apparatus 50 in order to release stored mechanical energy to cause the separation of the electric contacts 51, 52.

The switching apparatus 50 comprises the electric motor 10 for charging the actuation spring 54.

The electric motor 10 is operatively coupled to the actuation spring 54 by means of a coupling mechanism so that, when the electric motor 10 is operated, the actuation spring 54 is brought from a release state to a compression state.

The electric motor 10 is typically operated cyclically after the execution of each opening manoeuvre of the switching apparatus 50. In this way, the actuation spring 54 can store mechanical energy that will be employed in a following opening operation, when necessary.

For the sake of clarity, it is again specified that the electric motor 10 is also referred to as "spring charging motor" in the present description.

The spring charging motor 10 may be of DC or AC type as is advantageously fed by an auxiliary power supply 10B to which the electric motor 10 is electrically connected through a feeding line 10A.

The auxiliary power supply 10B may provide a suitable AC or DC voltage according to the needs.

Figure 2:
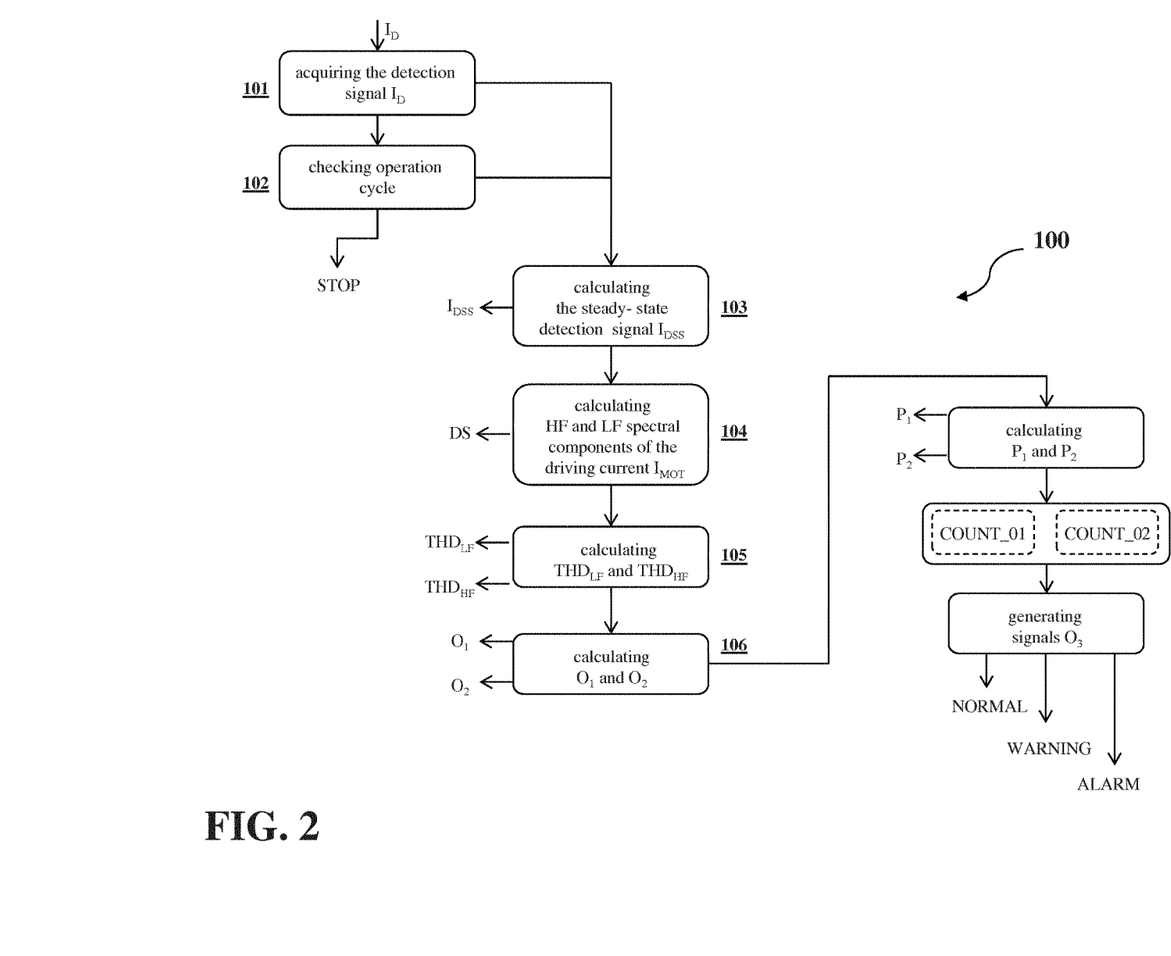
FIGS. 2-6 are block diagrams that schematically show an embodiment of the method, according to the present invention.

As mentioned above, an aspect of the present invention is related to a method 100 for determining the operating status of the spring charging motor 10 (FIG. 2).

The method 100 comprises a step 101 of acquiring a detection signal $I_D$ indicative of the behaviour of a driving current $I_{MOT}$, which feeds the spring charging motor 10 during an operation cycle of this latter.

The driving current $I_{MOT}$ is the feeding current provided by the auxiliary power supply 10B to drive the spring charging motor 10, when this latter is activated.

The detection signal $I_D$ may be acquired by means of current sensors of known type, which may include, for example, one or more Hall sensors. Said current sensors may be operatively coupled to suitably arranged circuits or processing resources to provide the detection signal $I_D$ in a digital or analogic form, depending on the needs.

Preferably, the method 100 comprises also the step 102 of checking whether the operation cycle of the spring charging motor 10 is correctly executed.

Figure 3:
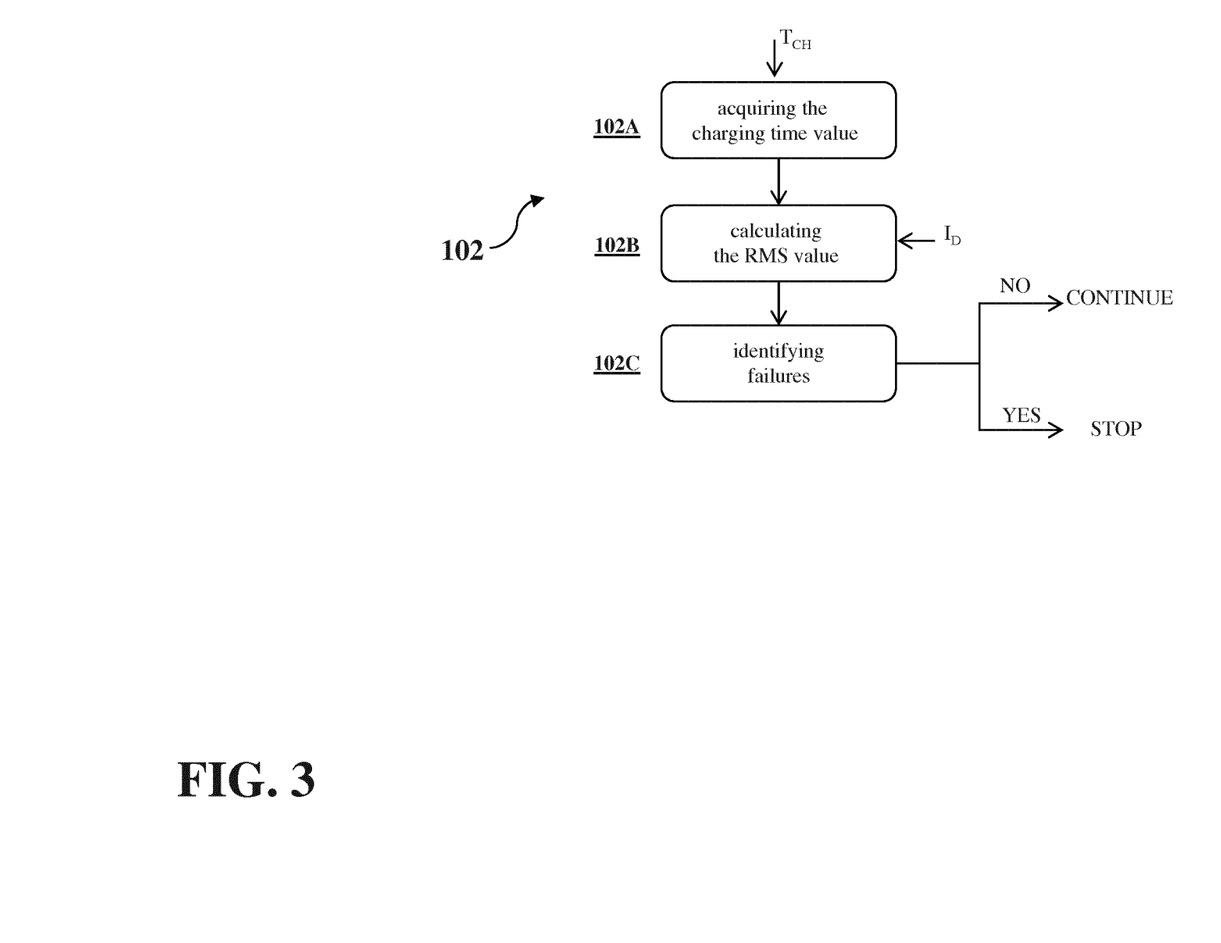

Referring to FIG. 3, the step 102 of the method 100 preferably comprises the sub-step 102A of acquiring a charging time value $T_{CH}$ of the actuation spring 54.

The charging time value $T_{CH}$ may be acquired by means of suitable position sensors of known type (not shown), which are configured to detect an initial position and an end position of the actuation spring 54 during the charging process of this latter.

Preferably, the step 102 of the method 100 comprises the sub-step 102B of calculating a RMS ("Root Mean Square") value $I_{RMS}$ of the driving current $I_{MOT}$.

The calculation of the RMS value $I_{RMS}$ may be carried out by suitably processing the acquired detection signal $I_D$ through suitable algorithms of known type.

Preferably, the step 102 of the method 100 comprises the sub-step 102C of identifying possible failure conditions on the base of the charging time value $T_{CH}$ and the RMS value $I_{RMS}$.

The identification of such possible failure conditions may be performed by comparing the charging time value $T_{CH}$ and the RMS value $I_{RMS}$ with predefined corresponding reference values, which are indicative of normal conditions for the electric motor 10.

As an example, failure conditions may be present if the charging time value $T_{CH}$ is higher than 15 s and/or the RMS value $I_{RMS}$ is higher than the 150% of the RMS value in normal conditions.

If failure conditions are identified, the method 100 is terminated and an alarm signal is advantageously generated. Otherwise, the subsequent steps of the method 100 are executed.

The method 100 comprises a step 103 of calculating a steady-state detection signal $I_{DSS}$ indicative of the behaviour of the driving current $I_{MOT}$ during a steady-state time interval $T_{SS}$, which is comprised in the operation cycle of the spring charging motor 10.

Figure 7:
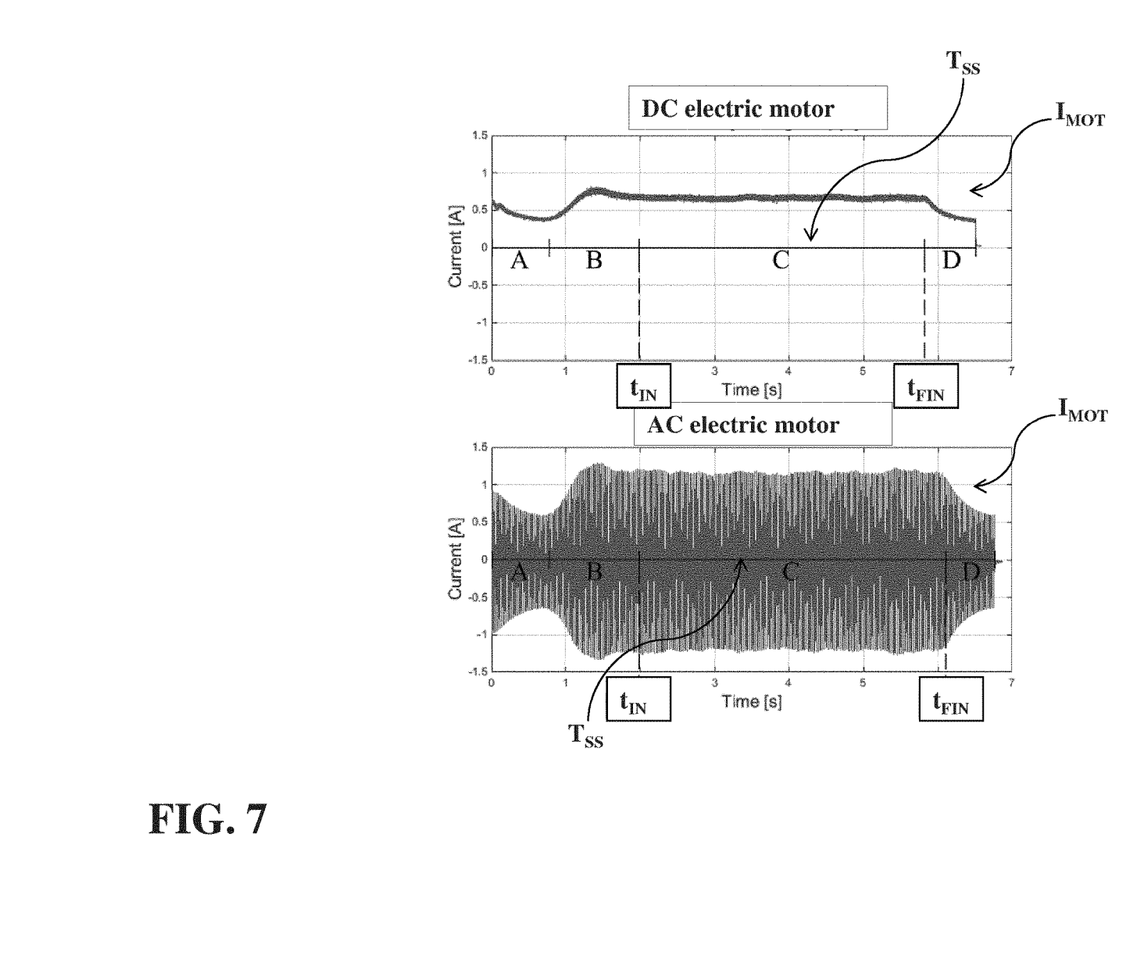
FIGS. 7-9 are diagrams that schematically show an illustrative behaviour of the driving current in spring charging motors comprised in MV switching apparatuses.

In FIG. 7, it is shown the behaviour of the driving current $I_{MOT}$ of a DC spring charging motor and of an AC spring charging motor, which are employed to charge corresponding actuation springs of exemplary MV switching apparatuses 50, according to the invention.

For each case, the steady-state time interval $T_{SS}$ of the driving current $I_{MOT}$ is the time interval (time interval C), in which said driving current has a substantially constant amplitude.

The steady-state time interval $T_{SS}$ occurs after the initial transient periods A-B, in which the driving current $I_{MOT}$ shows remarkable variations due to the starting of the electric motor 10 and of the spring charging process, and before the final transient period D, in which the driving current $I_{MOT}$ shows remarkable variations due to the stopping of the electric motor 10 and the completion of the spring charging process.

The step 103 of calculating the steady-state detection signal $I_{DSS}$ is advantageously carried out by processing the acquired detection signal $I_D$.

Preferably, the detection signal $I_D$ is processed to identify the steady-state time interval $T_{SS}$.

Figure 4:
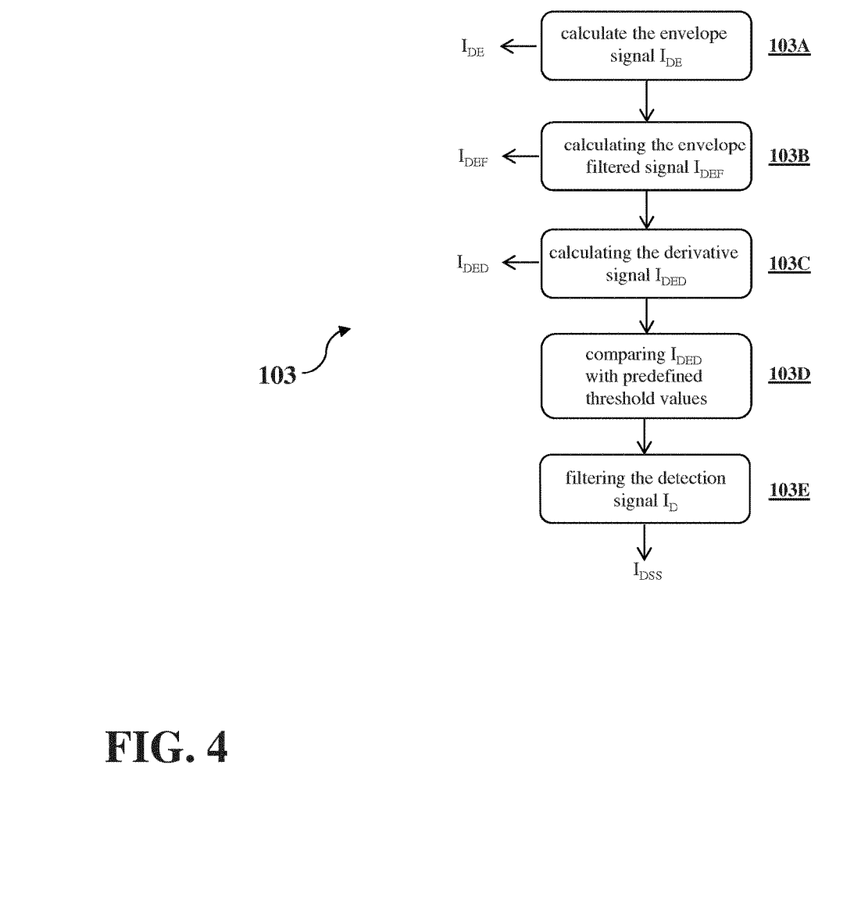

To this aim, the step 103 preferably comprises the sequence of sub-steps 103A-103E described below.

Preferably, the step 103 comprises the sub-step 103A of calculating an envelope signal $I_{DE}$ indicative of the envelope of the detection signal $I_D$. This step is quite useful to reduce processing errors when the driving current $I_{MOT}$ is an AC current.

Preferably, the step 103 comprises the sub-step 103B of calculating a filtered envelope signal $I_{DEF}$ by executing a frequency-domain low-pass filtering of the envelope signal $I_{DE}$. This step is quite useful to determine the actual trend of the mean value of the driving current $I_{MOT}$. Suitable low-pass Butterworth filters may be used to implement this step.

Preferably, the step 103 comprises the sub-step 103C of calculating the derivative signal $I_{DED}$ indicative of the derivative of the low-pass filtered envelope signal $I_{DEF}$. Suitable processing algorithms of known type may be used to this aim.

Preferably, the step 103 comprises the sub-step 103D of comparing the derivative signal $I_{DED}$ with one or more predefined threshold values to identify the initial and final instants $t_{IN}$, $t_{FIN}$ of the steady-state time interval $T_{SS}$ (FIG. 7).

Preferably, the derivative signal $I_{DED}$ is compared with a first predefined threshold value to identify the initial instant $t_{IN}$ and with a second predefine threshold value the final instant $t_{FIN}$. An example, the initial instant $t_{IN}$ may be the instant in which the derivative signal $I_{DED}$ crosses the first predefined threshold value whereas the final instant $t_{FIN}$ may be the instant in which the derivative signal $I_{DED}$ crosses the second predefined threshold value.

Once the steady-state time interval $T_{SS}$ is identified, the steady-state detection signal $I_{DSS}$ may be obtained by executing a time-domain filtering of the detection signal $I_D$ on the base of the steady-state time interval $T_{SS}$, as preferably provided by a further step 103E comprised in the step 103 of the method 100. Suitable processing algorithms of known type may be used to this aim.

The method 100 comprises a step 104 of calculating data DS indicative of the high frequency (HF) spectral components and the low frequency (LF) spectral components of the driving current $I_{MOT}$ during the steady-state time interval $T_{SS}$.

As an example, LF spectral components may identify spectral components having frequencies of some tens of Hz (e.g. about 50 Hz) whereas HF spectral components may identify spectral components having frequencies of some hundreds or some thousands of Hz.

The calculation of the data DS is advantageously carried out by suitably processing the steady-state detection signal $I_{DSS}$.

Preferably, the calculation of the data DS comprises calculating the FFT (Fast Fourier Transform) of the steady-state detection $I_{DSS}$.

According to an embodiment of the invention (FIG. 5), the step 104 preferably comprises the sub-step 104A of executing a frequency-domain low-pass filtering of the steady-state detection signal $I_{DSS}$. A suitable low-pass filter of known type may be adopted to this aim.

Figure 5:
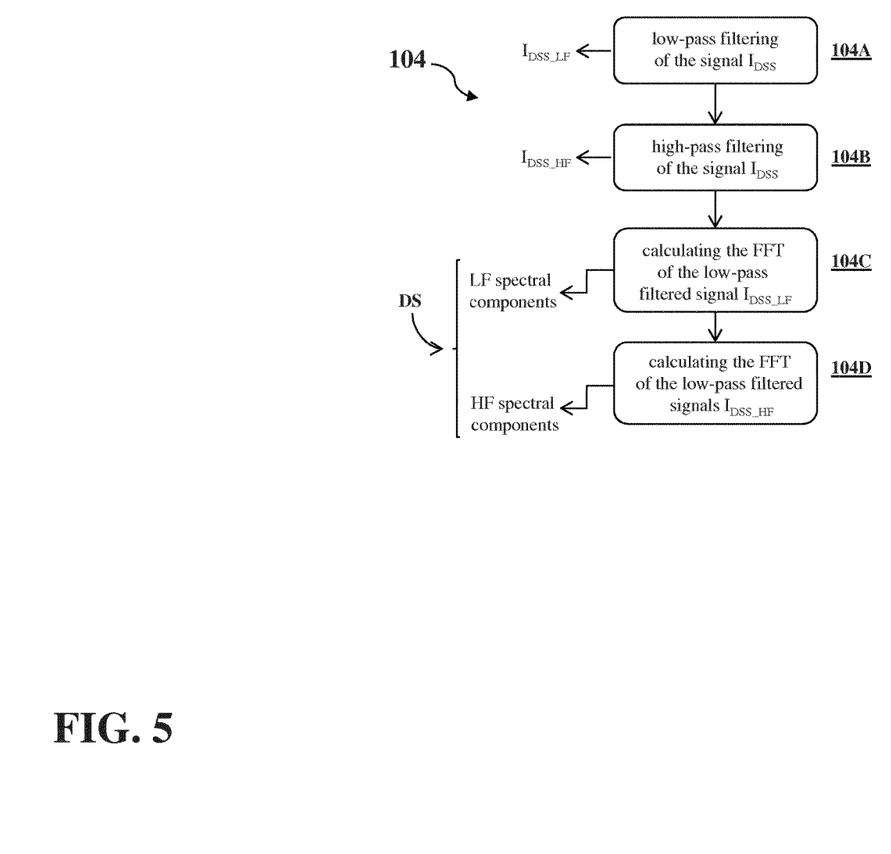

A low-pass filtered steady-state detection signal $I_{DSS-LF}$ is advantageously calculated by executing the step 104A.

The signal $I_{DSS-LF}$ is indicative only of the LF signal components of the driving current $I_{MOT}$ during the steady-state time interval $T_{SS}$.

Preferably, the step 104 comprises the sub-step 104B of executing a frequency-domain high-pass filtering of the steady-state detection signal $I_{DSS}$. A suitable high-pass filter of known type may be adopted to this aim.

A high-pass filtered steady-state detection signal $I_{DSS-LF}$ is advantageously calculated by executing the step 104B.

The signal $I_{DSS-HF}$ is indicative only of the HF signal components of the driving current $I_{MOT}$ during the steady-state time interval $T_{SS}$.

Preferably, the step 104 comprises the sub-step 104C of calculating the FFT (Fast Fourier Transform) of the low-pass filtered steady-state detection $I_{DSS-LF}$. The LF spectral components of the driving current $I_{MOT}$ are thus obtained.

Preferably, the step 104 comprises the sub-step 104D of calculating the FFT (Fast Fourier Transform) of the high-pass filtered steady-state detection $I_{DSS-HF}$. The HF spectral components of the driving current $I_{MOT}$ are thus obtained.

According to another embodiment of the invention (FIG. 6), the step 104 preferably comprises the sub-step 104E of calculating the FFT of the steady-state detection $I_{DSS}$ without any preliminary filtering operation to isolate the LF, HF spectral components.

Figure 6:
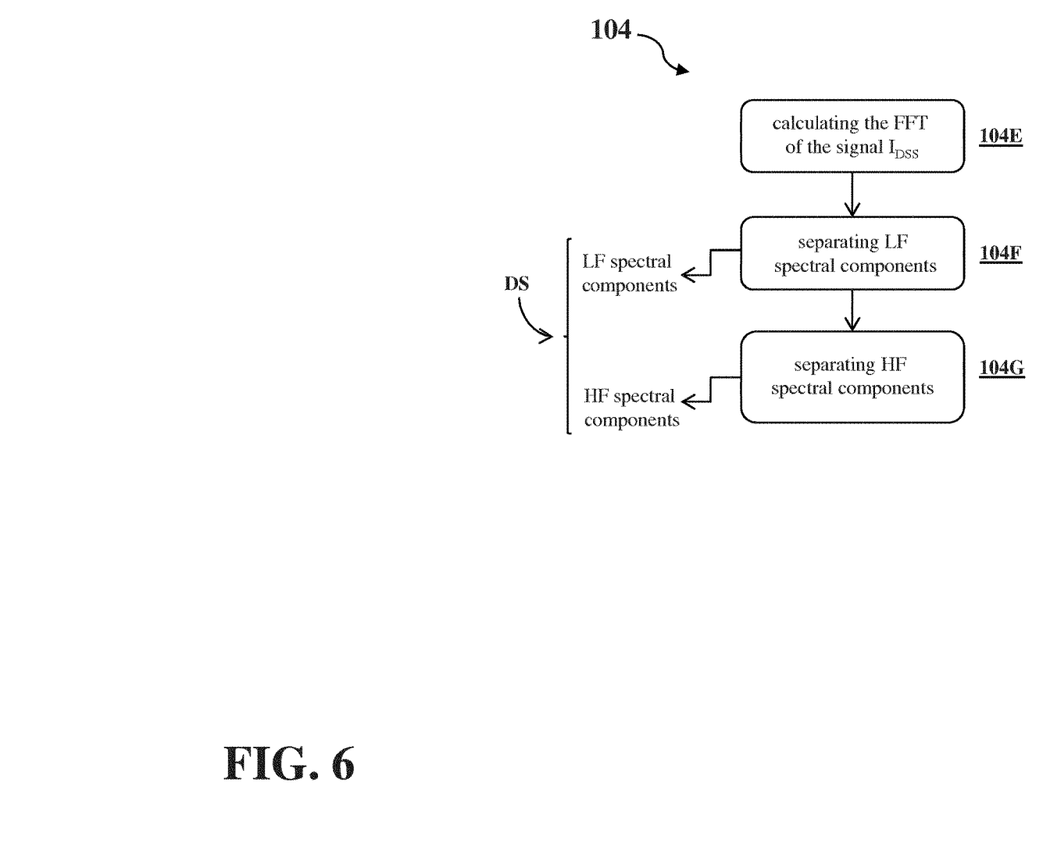

Then, the step 104 preferably comprises the steps 104E, 104F of separating the LF and HF spectral components of the driving current $I_{MOT}$ during the steady-state interval $T_{SS}$, respectively.

The separation of the LF and HF spectral components from the data obtained by means of the above FFT calculation may be carried out by means of selection algorithms of known type.

The method 100 comprises a step 105 of calculating a first harmonic distortion value $THD_{LF}$ and a second harmonic distortion value $THD_{HF}$, which are respectively indicative of the total harmonic distortion of the LF and HF spectral components of the driving current $I_{MOT}$ during the steady-state time interval $T_{SS}$.

The first harmonic distortion value $THD_{LF}$ may be calculated by suitable processing the data DS. Algorithms of known type, which calculate, for example, the ratio of the sum of the amplitudes of all LF harmonic components to the power of the fundamental frequency of the driving current $I_{MOT}$, during the steady-state time interval $T_{SS}$, may be used The first harmonic distortion value $THD_{LF}$ advantageously provides a quantitative information about the overall distortion introduced by the LF spectral components of the driving current $I_{MOT}$ during the steady-state time interval $T_{SS}$.

Also the second harmonic distortion value $THD_{HF}$ may be calculated by suitable processing the data DS. Algorithms of known type, which calculate, for example, the ratio of the sum of the amplitudes of all HF harmonic components to the power of the fundamental frequency of the driving current $I_{MOT}$, during the steady-state time interval $T_{SS}$, may be used.

The second harmonic distortion value $THD_{HF}$ advantageously provides a quantitative information about the overall distortion introduced by the HF spectral components of the driving current $I_{MOT}$ during the steady-state time interval $T_{SS}$.

The method 100 comprises a step 106 of calculating first and second output data $O_1$ and $O_2$, which are respectively indicative of the variations of the first and second harmonic distortion values $THD_{LF}$, $THD_{HF}$ with respect to corresponding first and second reference values.

Preferably, said reference values are indicative of normal or acceptable conditions for the electric motor.

The first and second output data $O_1$, $O_2$ may be calculated by suitably processing the first and second harmonic distortion values $THD_{LF}$, $THD_{HF}$, respectively.

As an example, each harmonic distortion value $THD_{LF}$, $THD_{HF}$ may be compared with predefined corresponding values calculated when the electric motor 10 is installed or, more in general, is for sure in good conditions.

The first and second output data $O_1$, $O_2$ advantageously provide quantitative information about the occurring of decay phenomena in the spring charging motor 10.

As an example, harmonic distortion values $THD_{LF}$, $THD_{HF}$ may be considered as normal or acceptable in case they are below of the 50% of corresponding predefined values calculated when the electric motor 10 is installed or in good conditions.

The method 100, according to the invention, finds its rationale in that the behavior of the driving current $I_{MOT}$, during the steady-state time interval $T_{SS}$, may advantageously provide information concerning the operative status of the spring charging motor 10.

In fact, it has been found that the behavior of the driving current $I_{MOT}$, during the steady-state time interval $T_{SS}$, is influenced by possible decay phenomena of electrical and/or mechanical components of the spring charging motor 10.

More particularly, it has been surprisingly found that possible decay phenomena of mechanical parts of the electric motor 10 (e.g. due to bending, breakage, friction, wear and the like) cause an increase of the harmonic distortion of the LF spectral components of the driving current $I_{MOT}$, during the steady-state time interval $T_{SS}$.

Figure 8:
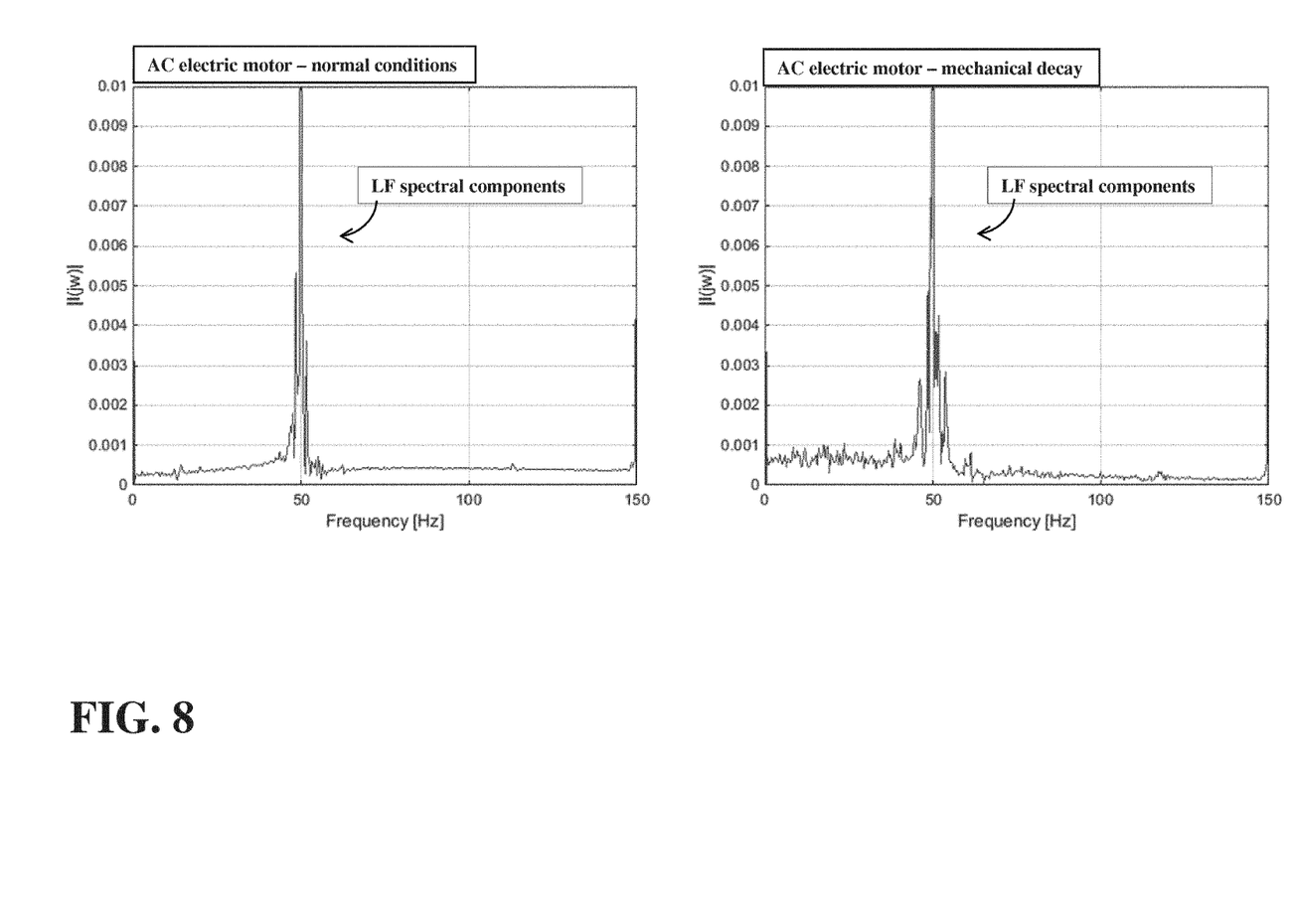

This is evident from FIG. 8 where the LF spectral components of an AC spring charging motor in normal conditions and in presence of decay phenomena of some mechanical components are illustrated by way of example.

Also, it has been surprisingly found that possible decay phenomena of electrical parts of the electric motor 10 (e.g. due to brush consumption, isolation leakages and the like) cause an increase of the harmonic distortion of the HF spectral components of the driving current $I_{MOT}$, during the steady-state time interval $T_{SS}$.

Figure 9:
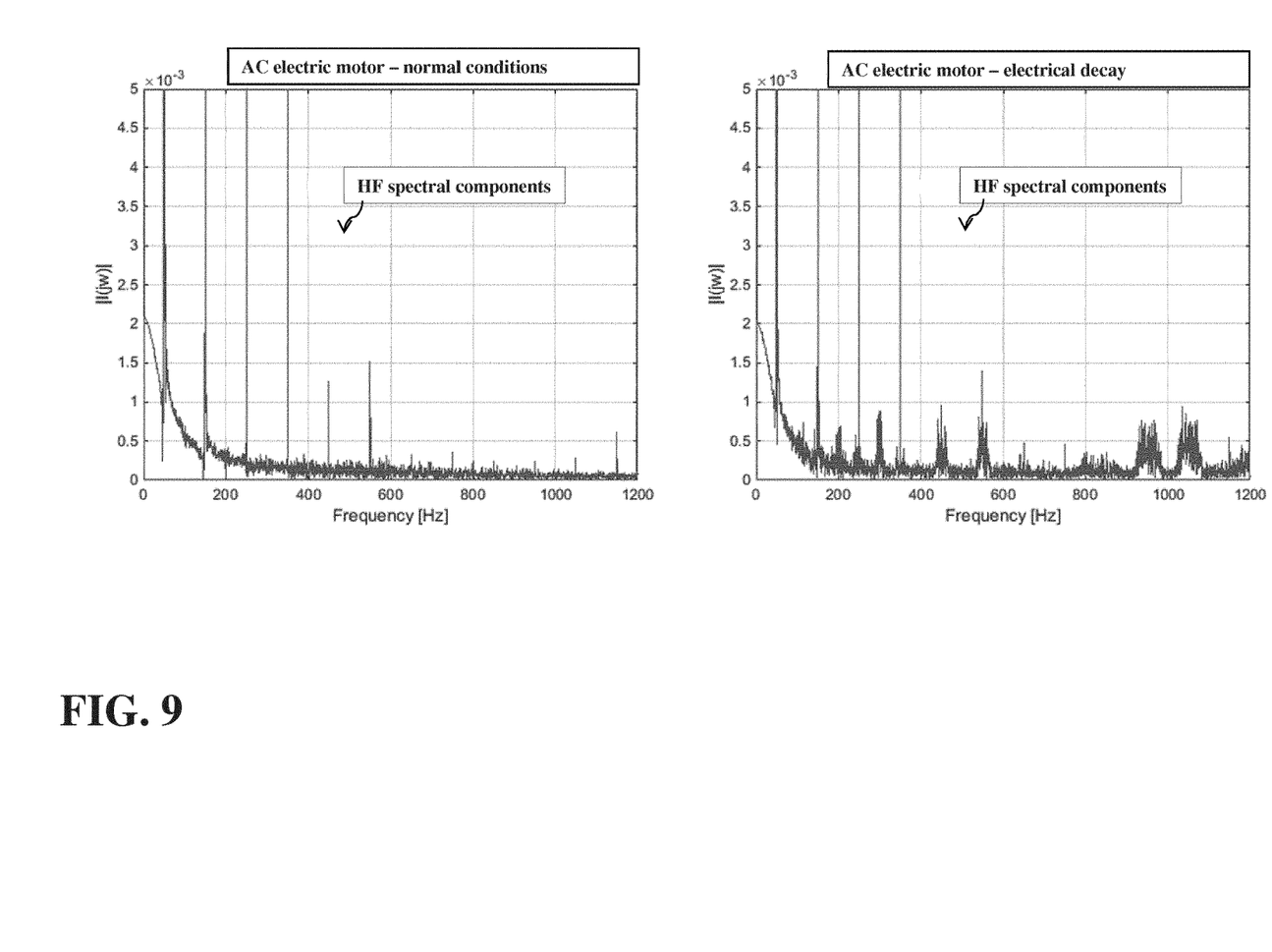

This is evident from FIG. 9 where the HF spectral components of an AC spring charging motor in normal conditions and in presence of decay phenomena of some electrical components are illustrated by way of example.

The method 100 advantageously provides a sequence processing steps to identify the steady-state time interval $T_{SS}$ of the driving current $I_{MOT}$ during an operating cycle of the spring charging motor 10 and to analyze (providing suitable quantitative parameters) the LF and HF spectral components of the driving current $I_{MOT}$, during said steady-state time interval $T_{SS}$.

The method 100 thus allows collecting reliable diagnostic information about the actual operative status of the electric motor 10.

Such a diagnostic information is represented by the first and second output data $O_1$, $O_2$, which provide quantitative information about the actual departure of the electric motor 10 from normal operative conditions due to possible decay phenomena.

As they are indicative of the variation of the first harmonic distortion value $THD_{LF}$ with respect to a corresponding first reference value, the output data $O_1$ indicate whether some mechanical components of the spring charging motor 10 are subject to decay phenomena.

On the other hand, as they are indicative of the variation of the second harmonic distortion value $THD_{HF}$ with respect to a corresponding second reference value, the output data $O_2$ indicate whether some electrical components of the spring charging motor 10 are subject to decay phenomena.

Advantageously, the output data $O_1$, $O_2$ may be corrected as a function of auxiliary diagnostic information (such as the charging time value $T_{CH}$ and the RMS value $I_{RMS}$) in order to improve the overall accuracy of the collected diagnostic information.

In a preferred embodiment, the method 100 is adapted to provide predictive information on the residual life of the spring charging motor 10 on the base of the diagnostic information collected at the steps described above, in particular on the base of the output data $O_1$, $O_2$.

Preferably, the method 100 comprises the step 107 (FIG. 2) of calculating first and second predictive data $P_1$, $P_2$, which are indicative of the residual life of the mechanical and electrical components of the spring charging motor 10, respectively.

The first predictive data $P_1$, $P_2$ are advantageously calculated by processing the first and second output data $O_1$, $O_2$, e.g. by means of suitable conversion tables.

Preferably, the first predictive data $P_1$ and the second predictive data $P_2$ are suitably corrected as a function of auxiliary diagnostic information (such as the charging time value $T_{CH}$ and the RMS value $I_{RMS}$) to improve the overall accuracy of the predictive information so obtained.

In a preferred embodiment of the present invention, the method 100 comprises the step 107A of providing a first counter COUNT_01 and a second counter COUNT_02.

The first counter COUNT_01 is indicative of the residual life of the mechanical components of the spring charging motor 10 whereas the second counter COUNT_02 is indicative of the residual life of the electrical components of the spring charging motor 10.

In this case, the first predictive data P1 and the second predictive data P2 preferably comprise first updating values and second updating values to update the first counter COUNT_01 and the second counter COUNT_02, respectively.

The first and second counters COUNT_01, COUNT_02 are advantageously updated on the base of the first and second predictive data $P_1$, $P_2$, respectively.

As an example, the first counter COUNT_01 and the second counter COUNT_02 may be set at given maximum values at the installation of the spring charging motor 10 and the updating process of the first counter COUNT_01 and of the second counter COUNT_02 may be carried out every time the method 100 is executed.

As an example, the following updating procedure may be adopted:
  providing updating data $P_1$ to decrease the first counter COUNT_01 if the first output data $O_1$ are indicative of an increase of the first harmonic distortion value $THD_{LF}$;
  providing updating data $P_1$ to increase the first counter COUNT_01 if the first output data $O_1$ are indicative of no increase or of a decrease of the first harmonic distortion value $THD_{LF}$;
  providing updating data $P_2$ to decrease the second counter COUNT_02 if the second output data $O_2$ are indicative of an increase of the second harmonic distortion value $THD_{HF}$;
  providing updating data $P_2$ to increase the second counter COUNT_02 if the second output data $O_2$ are indicative of no increase or of a decrease of the second harmonic distortion value $THD_{HF}$.

Of course, the counters COUNT_01 and COUNT_02 may be set in different manners and they may be updated according to processing logics different from the one described above.

In a preferred embodiment, the method 100 comprises the step 108 of generating second output signals $O_3$ indicative of the operative status of the spring charging motor 10.

The output signals $O_3$ are advantageously adapted to provide a qualitative information on the operative status of the spring charging motor 10, which derives from the output data $O_1$, $O_2$. Preferably, the second output signals $O_3$ comprise:
  a signal NORMAL, which indicates that the electric motor 10 is in good conditions;
  a signal WARNING, which indicates that a sufficient number of operations of the spring charging motor 10 is still guaranteed even if this latter is affected by some decay phenomena of its electrical and/or mechanical components;
  a signal ALARM, which indicates that no operations or an insufficient number of operations of the spring charging motor 10 are guaranteed as this latter is affected by serious decay phenomena of its electrical and/or mechanical components.

Preferably, the output signals $O_3$ are advantageously generated on the base of the status of the counters COUNT_01, COUNT_02 described above.

Referring again to the example described above, the second output signals $O_3$ may be generated when at least one of the counters COUNT_01, COUNT_02 decreases below a respective predefined counting value, which may be set during the installation operation of the spring charging motor 10.

The signals $O_3$ may be however generated on the base of processing logics different from the one described above.

The output signals $O_3$ may be control signals for a HMI (Human Machine Interface), which is adapted to show corresponding visual information (or visual signals) on the base of these signals.

The output signals $O_3$ may be control signals for an external computerised device, even positioned remotely.

Preferably, the method 100 is implemented in a digital manner by one or more digital processing units, e.g. by one or more microprocessors.

The method 100 can be easily implemented in practice and it requires relative small calculation resources for being carried out.

Preferably, the method 100 is advantageously carried out at each operation cycle of the spring charging motor 10. In this way, predictive information about the residual life of the spring charging motor 10 may be updated in a continuous manner.

As mentioned above, a further aspect of the present invention is related to a computerised diagnostic system for determining the operating status of the spring charging motor 10 (FIG. 1).

The diagnostic system 1 comprises sensing means 2 adapted to provide the detection signal $I_D$, as described above.

The sensing means 2 preferably comprise one or more current sensors 21 of known type, which may include, for example, one or more Hall sensors.

The sensing means 2 are advantageously arranged so that the current sensors 21 are operatively coupled to the feeding line 10A, which electrically connects the spring charging motor 10 to the auxiliary power supply 10A feeding the driving current $I_{MOT}$ during an operation cycle of the electric motor 10.

The sensing means 2 may comprise interface processing circuitry 22 to process the measuring signals output by the current sensors 21 and provide the detection signal $I_D$.

Preferably, the sensing means 2 are configured to provide the detection signals $I_D$ in a digital form. To this main, the mentioned interface processing circuitry 22 may comprise digital sampling means.

The diagnostic system 1 preferably comprises a first control unit 3, which is operatively connected to the sensing means 2 in a wired or wireless manner.

The first control unit 3, which is in communication with the sensing means 2, is advantageously configured to execute some processing steps to implement the method 100 described above.

In particular, the control unit 3 is configured to:
acquire the detection signal $I_D$ (described above) from the sensor means 2;
process the detection signal $I_D$ to calculate the steady-state detection signal $I_{DSS}$ described above;
process the steady-state detection signal $I_{DSS}$ to calculate the data DS described above;
process the data DS to calculate the first and second harmonic distortion values $THD_{LF}$, $THD_{HF}$ described above;
process the first and second harmonic distortion values $THD_{LF}$, $THD_{HF}$ to calculate the first and second output data $O_1$, $O_2$ described above.

Preferably, the control 3 is configured to:
process the detection signal $I_D$ to identify the steady-state interval $T_{SS}$ described above;
execute a time-domain filtering of the detection signal $I_D$ on the base of the steady-state time interval TSS to calculate the steady-state detection signal $I_{DSS}$ described above.

Preferably, the control 3 is configured to:
calculate an envelope signal $I_{DE}$ described above;
execute a frequency-domain low-pass filtering of the envelope signal $I_{DE}$ to calculate the low-pass filtered envelope signal $I_{DEF}$ described above;
calculate the derivative signal $I_{DED}$ described above;
compare the derivative signal $I_{DED}$ with one or more predefined threshold values to identify the initial instant $t_{IN}$ and the final instant $t_{FIN}$ of the steady-state time interval $T_{SS}$.

According to an aspect of the invention, the control 3 may be preferably configured to:
execute a frequency-domain low-pass filtering of the steady-state detection signal $I_{DSS}$ to calculate the low-pass filtered steady-state detection signal $I_{DSS\_LF}$ described above;
execute a frequency-domain high-pass filtering of the steady-state detection signal $I_{DSS}$ to calculate a high-pass filtered steady-state detection signal $I_{DSS\_HF}$ described above;
calculate the FFT of the low-pass filtered steady-state detection signal $I_{DSS\_LF}$;
calculate the FFT of the high-pass filtered steady-state detection signal $I_{DSS\_HF}$.

According to another aspect of the invention, the control 3 may be preferably configured to:
calculate the FFT of the steady-state detection signal $I_{DSS}$;
separating the LF spectral components of the driving current $I_{MOT}$ during the steady-state interval $T_{SS}$ from the data obtained with said FFT calculation;
separating the HF spectral components of the driving current $I_{MOT}$ during the steady-state interval $T_{SS}$ from the data obtained with said FFT calculation.

Preferably, the first control unit 3 comprises one or more digital processing units (e.g. one or more microprocessors) adapted to execute software instructions storable in a medium.

Preferably, the first control unit 3 comprises one or more digital processing units adapted to execute software instructions for implementing the processing steps described above.

In a preferred embodiment of the diagnostic system 1, the sensing means 2 and the first control unit 3 are embedded in a single monitoring and diagnostic device 23 of the switching apparatus 50.

The diagnostic system 1 preferably comprises a second control unit 4, which is operatively connected to the first control unit 3 in a wired or wireless manner.

The second control unit 4, which is in communication with the first control unit 3, is advantageously configured to execute some processing steps to implement the method 100 described above.

In particular, the control unit 4 is configured to:
acquire the first and second output data $O_1$, $O_2$ described above from the first control unit 3;
process the first output data $O_1$ to calculate the first predictive data $P_1$, described above;
process the second output data $O_2$ to calculate the second predictive data $P_2$, described above.

Preferably, the second control unit 4 comprises the first and second counters COUNT_01, COUNT_02 described above.

In this case, as described above, the first predictive data P1 and the second predictive data P2 preferably comprise first updating values and second updating values to update the first counter COUNT_01 and the second counter COUNT_02, respectively.

Preferably, the second control unit 4 is configured to generate the second output signals $O_3$ described above.

The output signals $O_3$ may comprise control signals for a local HMI 42, which is operatively connected with the second control unit 4.

The HMI 42, which communicates with the control unit 4, is adapted to show visual information (or visual signals) corresponding to the control signals (e.g. the signals NORMAL, WARNING, ALARM) included in the output signals $O_3$.

The output signals $O_3$ may also be acquired by an external computerized device (not shown) that is connectable with the control unit 4 in a wired or wireless manner.

The external computerised device may even be remotely positioned with respect to the control unit 4.

Preferably, the first control unit 4 comprises one or more digital processing units (e.g. one or more microprocessors) adapted to execute software instructions storable in a medium.

Preferably, the first control unit 4 comprises one or more digital processing units adapted to execute software instructions for implementing the processing steps described above.

Preferably, also the first and second counters COUNT_01, COUNT_02 described above are digitally implemented by the one or more digital processing units of the control unit 4.

In a preferred embodiment of the diagnostic system 1, the second control unit 4 is embedded in a diagnostic unit 41 of the switching apparatus 50.

Preferably, the diagnostic unit 41 comprises also the HMI 42 described above.

Preferably, the diagnostic unit 41 is connectable in a wired or wireless manner with an external computerised device, which may even be remotely positioned with respect to the diagnostic unit 41.

The method 100 and the diagnostic system 1, according to the invention, allow collecting reliable data about the actual operating status of the spring charging motor 10, more particularly about the actual operating status of its mechanical components and/or electrical components.

The method 100 and the diagnostic system 1, according to the invention, allow providing reliable predictive information about the residual life of the spring charging motor 10, more particularly about the residual life of its mechanical components and/or electrical components.

The method 100 does not require special preliminary characterization steps of the spring charging motor 10 for being executed.

The method 100 is particularly suitable for being executed in remote monitoring and diagnostic methods for electric power distribution networks.

The diagnostic system 1, according to the invention, requires relatively small hardware and software resources for implementing the processing steps of the method 100.

The diagnostic system 1, according to the invention, may be easily integrated in a smart monitoring and diagnostic system for electric power distribution networks.

The method 100 and the diagnostic system 1, according to the invention, may be easily implemented at industrial level, at competitive costs with the technical solutions currently available.

The invention claimed is:

1. A method for determining the operating status of a spring charging motor of a switching apparatus wherein it comprises the following steps:
   acquiring a detection signal ($I_D$) indicative of the behaviour of a driving current ($I_{MOT}$), which feeds said spring charging motor during an operation cycle of said spring charging motor;
   processing said detection signal ($I_D$) to calculate a steady-state detection signal ($I_{DSS}$) indicative of the behaviour of said driving current ($I_{MOT}$) during a steady-state time interval ($T_{SS}$) comprised in the operation cycle of said spring charging motor;
   processing said steady-state detection signal ($I_{DSS}$) to calculate data (DS) indicative of high frequency and low frequency spectral components of said driving current ($I_{MOT}$) during said steady-state time interval;
   processing said data (DS) indicative of said high frequency and low frequency spectral components to calculate first and second harmonic distortion values ($THD_{LF}$, $THD_{HF}$), which are indicative of the total harmonic distortion of said high frequency and low frequency spectral components, respectively;
   processing said first and second harmonic distortion values to calculate first and second output data ($O_1$, $O_2$), which are indicative of the variations of said first and second harmonic distortion values with respect to corresponding first and second reference values, respectively.

2. The method, according to claim 1, which further comprises the following steps:
   processing said detection signal ($I_D$) to identify said steady-state interval ($T_{SS}$); and
   executing a time-domain filtering of said detection signal on the base of said steady-state time interval.

3. The method, according to claim 2, wherein said step of processing said detection signal ($I_D$) to identify said steady-state interval comprises the following steps:
   calculating an envelope signal ($I_{DE}$) indicative of the envelope of said detection signal;
   executing a frequency-domain low-pass filtering of said envelope signal to calculate a low-pass filtered envelope signal ($I_{DEF}$);
   calculating a derivative signal ($I_{DED}$) indicative of the derivative of said low-pass filtered envelope signal;
   comparing said derivative signal ($I_{DED}$) with one or more predefined threshold values to identify an initial instant ($t_{IN}$) and a final instant ($t_{FIN}$) of said steady-state time interval ($T_{SS}$).

4. The method, according to claim 3, which further comprises the following steps:
   processing said first output data ($O_1$) to calculate first predictive data ($P_1$) indicative of the residual life of mechanical components of said spring charging motor; and
   processing said second output data ($O_2$) to calculate second predictive data ($P_2$) indicative of a residual life of electrical components of said spring charging motor.

5. The method, according to claim 4, which further comprises the step of:
   providing a first counter (COUNT_01) of the residual life of mechanical components of said spring charging motor, said first predictive data ($P_1$) comprising first updating values of said first counter (COUNT_01);
   providing a second counter (COUNT_02) of the residual life of electrical components of said spring charging motor, said second predictive data ($P_2$) comprising second updating values of said second counter (COUNT_02).

6. The method, according to claim 2, which further comprises the following steps:
   processing said first output data ($O_1$) to calculate first predictive data ($P_1$) indicative of the residual life of mechanical components of said spring charging motor; and processing said second output data ($O_2$) to calculate second predictive data ($P_2$) indicative of a residual life of electrical components of said spring charging motor.

7. The method, according to claim 6, which further comprises the step of:
providing a first counter (COUNT_01) of the residual life of mechanical components of said spring charging motor, said first predictive data ($P_1$) comprising first updating values of said first counter (COUNT_01);
providing a second counter (COUNT_02) of the residual life of electrical components of said spring charging motor, said second predictive data ($P_2$) comprising second updating values of said second counter (COUNT_02).

8. The method, according to claim 1, which further comprises the following steps:
processing said first output data ($O_1$) to calculate first predictive data ($P_1$) indicative of the residual life of mechanical components of said spring charging motor; and
processing said second output data ($O_2$) to calculate second predictive data ($P_2$) indicative of a residual life of electrical components of said spring charging motor.

9. The method, according to claim 8, which further comprises the step of:
providing a first counter (COUNT_01) of the residual life of mechanical components of said spring charging motor, said first predictive data ($P_1$) comprising first updating values of said first counter (COUNT_01);
providing a second counter (COUNT_02) of the residual life of electrical components of said spring charging motor, said second predictive data ($P_2$) comprising second updating values of said second counter (COUNT_02).

10. The method, according to claim 9, which further comprises the step of generating second output signals ($O_3$) indicative of the operative status of said spring charging motor on the base of an operative status of said first and second counters (COUNT_01, COUNT_02).

11. A diagnostic system for determining the operating status of a spring charging motor of a switching apparatus wherein it comprises:
sensing means adapted to provide a detection signal ($I_D$) indicative of the behaviour of a driving current ($I_{MOT}$), which feeds said spring charging motor, and a first control unit configured to:
acquire a detection signal ($I_D$) indicative of the behaviour of said driving current ($I_{MOT}$) during an operation cycle of said spring charging motor;
process said detection signal ($I_D$) to calculate a steady-state detection signal ($I_{DSS}$) indicative of the behaviour of said driving current ($I_{MOT}$) during a steady-state time interval ($T_{SS}$) comprised in the operation cycle of said spring charging motor;
process said steady-state detection signal ($I_{DSS}$) to calculate data (DS) indicative of high frequency and low frequency spectral components of said driving current ($I_{MOT}$) during said steady-state time interval;
process said data (DS) indicative of said high frequency and low frequency spectral components to calculate first and second harmonic distortion values ($THD_{LF}$, $THD_{HF}$), which are indicative of the total harmonic distortion of said high frequency and low frequency spectral components, respectively;
processing said first and second harmonic distortion values to calculate first and second output data ($O_1$, $O_2$), which are indicative of the variations of said first and second harmonic distortion values with respect to corresponding first and second reference values, respectively.

12. The diagnostic system, according to claim 11, wherein said first control unit is configured to:
process said detection signal ($I_D$) to identify said steady-state interval ($T_{SS}$); and
execute a time-domain filtering of said detection signal on the base of said steady-state time interval.

13. The diagnostic system, according to claim 12, wherein said first control unit is configured to:
calculate an envelope signal ($I_{DE}$) indicative of the envelope of said detection signal ($I_D$);
execute a frequency-domain low-pass filtering of said envelope signal to calculate a low-pass filtered envelope signal ($I_{DEF}$);
calculate a derivative signal ($I_{DED}$) indicative of the derivative of said low-pass filtered envelope signal; and
compare said derivative signal ($I_{DED}$) with one or more predefined threshold values to identify an initial instant ($t_{IN}$) and a final instant ($t_{FIN}$) of said steady-state time interval ($T_{SS}$).

14. The diagnostic system, according to claim 12, which further comprises a second control unit, which is communication with said first control unit, said second control unit being configured to:
acquire said first and second output data ($O_1$, $O_2$) from said first control unit;
process said first output data ($O_1$) to calculate first predictive data ($P_1$) indicative of a residual life of mechanical components of said spring charging motor;
process said second output data ($O_2$) to calculate second predictive data indicative ($P_2$) of the residual life of electrical components of said spring charging motor.

15. The diagnostic system, according to claim 11, which further comprises a second control unit, which is communication with said first control unit, said second control unit being configured to:
acquire said first and second output data ($O_1$, $O_2$) from said first control unit;
process said first output data ($O_1$) to calculate first predictive data ($P_1$) indicative of a residual life of mechanical components of said spring charging motor;
process said second output data ($O_2$) to calculate second predictive data indicative ($P_2$) of the residual life of electrical components of said spring charging motor.

16. The diagnostic system, according to claim 15, wherein said second control unit comprises:
a first counter (COUNT_01) of the residual life of mechanical components of said spring charging motor, said first predictive data ($P_1$) comprising first updating values of said first counter (COUNT_01);
a second counter (COUNT_02) of the residual life of electrical components of said spring charging motor, said second predictive data ($P_2$) comprising second updating values of said second counter (COUNT_02).

17. The diagnostic system, according to claim 16, wherein said second control unit is configured to generate second output signals ($O_3$) indicative of the operative status of said spring charging motor on the base of an operative status of said first and second counters (COUNT_01, COUNT_02).

18. The diagnostic system, according to claim 15, wherein said second control unit is embedded in a diagnostic unit of said switching apparatus.

19. The diagnostic system, according to claim 11, wherein said sensing means and said first control unit are embedded in a monitoring and diagnostic device of said switching apparatus.

20. A switching apparatus wherein it comprises a diagnostic system, according claim 7.

* * * * *